(12) United States Patent
Wang et al.

(10) Patent No.: US 7,529,078 B2
(45) Date of Patent: May 5, 2009

(54) LOW TUNNELING CURRENT MIM STRUCTURE AND METHOD OF MANUFACTURING SAME

(75) Inventors: Yu-Jen Wang, Hsinchu (TW); Hsing-Lien Lin, Hsinchu (TW); Yeur-Luen Tu, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 367 days.

(21) Appl. No.: 11/379,478

(22) Filed: Apr. 20, 2006

(65) Prior Publication Data
US 2007/0247784 A1 Oct. 25, 2007

(51) Int. Cl.
*H01G 4/38* (2006.01)
(52) U.S. Cl. .............. 361/328; 361/311; 361/312; 361/313; 361/321.1; 361/321.2
(58) Field of Classification Search ......... 361/328–330, 361/302–305, 311–313, 321.1, 321.2, 306.1; 438/395–397
See application file for complete search history.

(56) References Cited

U.S. PATENT DOCUMENTS

| | | | | |
|---|---|---|---|---|
| 5,633,781 A | * | 5/1997 | Saenger et al. ........... 361/321.4 |
| 6,069,051 A | * | 5/2000 | Nguyen et al. ............... 438/396 |
| 6,090,633 A | * | 7/2000 | Yu et al. ........................ 438/15 |
| 6,285,070 B1 | * | 9/2001 | Corisis et al. ................ 257/532 |
| 6,717,193 B2 | * | 4/2004 | Olewine et al. ............. 257/295 |
| 6,934,143 B2 | | 8/2005 | Chou et al. | |

OTHER PUBLICATIONS

US 6,882,028 (withdrawn).

* cited by examiner

*Primary Examiner*—Nguyen T Ha
(74) *Attorney, Agent, or Firm*—Baker & McKenzie LLP

(57) ABSTRACT

Disclosed herein are new MIM structures having increased capacitance with little or no tunneling current, and related methods of manufacturing the same. In one embodiment, the new MIM structure comprises a first electrode comprising a magnetic metal and having a magnetic moment aligned in a first direction, and a second electrode comprising a magnetic metal and having a magnetic moment aligned in a second direction antiparallel to the first direction. In addition, such an MIM structure comprises a dielectric layer formed between the first and second electrodes and contacting the first and second magnetic metals.

20 Claims, 3 Drawing Sheets

US 7,529,078 B2

LOW TUNNELING CURRENT MIM STRUCTURE AND METHOD OF MANUFACTURING SAME

TECHNICAL FIELD

Disclosed embodiments herein relate generally to metal-insulator-metal (MIM) structures, and more particularly to new MIM structures having increased capacitance with little or no tunneling current, and related methods of manufacturing the same.

BACKGROUND

Capacitors in electrical integrated circuits (ICs) are typically incorporated between the interconnect layers of a semiconductor wafer in order to maximize the use of the space between the interconnect layers. The capacitors formed between the interconnect layers are preferably of a metal-insulator-metal (MIM) construction, as the conductors of the interconnect layers are metal in construction. MIM capacitors may be used to store a charge in a variety of semiconductor devices, that may be utilized in the IC. For example, such MIM structures are one of the key devices in radio-frequency (RF). mixed-signal integrated circuit, and DRAM application.

Conventional MIM structures consume a relatively large percentage of the surface area of a semiconductor wafer or chip because they are typically constructed as a large flat structure formed by a low dielectric constant (k) silicon dioxide or nitride capacitor dielectric layer sandwiched between upper and lower metal electrodes, positioned parallel to the wafer surface. There is an ongoing challenge to maintain sufficiently high storage capacitance despite decreasing capacitor area, since capacitance is generally a function of electrode area. In order to reduce the area of these structures, yet obtain higher capacitance density per unit size, the prior art has attempted a few different approaches.

One approach has been to replace the low-k material used for the dielectric layer with high-k materials, such as $Al_2O_3$, HfO, and $Ta_2O_5$, having a k value higher than 9. However, such high-k materials do not adhere well to the metal electrodes, which are still relatively large, thereby leading to delaminations in the MIM structures. Another conventional approach of increasing capacitance has been is to reduce dielectric thickness. Capacitance is set forth in equation (1), $$C = k * \frac{A}{t} \quad (1)$$

where C=capacitance, k=dielectric constant, A=electrode area, and t=dielectric thickness).

An even more advantageous approach for gaining capacitance (per device size) would be to shrink the dielectric thickness and employ a high-k material simultaneously. Unfortunately, high-k materials are often incompatible with the idea of decreasing dielectric thickness due to the issue of leakage current. More specifically, as high-k dielectrics are made thinner, the propensity of leakage or "tunneling" current from electrode to electrode across the dielectric increases. Accordingly, an MIM capacitor structure is needed that utilizes wafer area more efficiently than conventional MIM capacitor structures, while using high-k dielectrics without the detrimental effects of leakage current.

SUMMARY

Disclosed herein are new MIM structures having increased capacitance with little or no tunneling current, and related methods of manufacturing the same. By preventing or drastically reducing leakage current across the dielectric insulator layer, an MIM structure constructed according to the disclosed principles allows the thickness of that layer to be extremely thin without the high risk of tunneling/leakage current that is typically present with such thin dielectrics. Such a thin dielectric layer in an MIM stack provides a high capacitance, despite its extremely thin size.

In one aspect, an MIM structure is provided. In one embodiment, the MIM structure comprises a first electrode comprising a magnetic metal and having a magnetic moment aligned in a first direction, and a second electrode comprising a magnetic metal and having a magnetic moment aligned in a second direction antiparallel to the first direction. In addition, such an MIM structure comprises a dielectric layer formed between the first and second electrodes and contacting the first and second magnetic metals.

In another aspect, a method of manufacturing an MIM structure is provided. In one embodiment, the method comprises forming a bottom electrode from a magnetic metal, growing a dielectric layer on the bottom electrode, and then forming a second electrode from a magnetic metal on the dielectric layer. Such a method further provides annealing the top and bottom electrodes to align a magnetic moment of the top electrode in a first direction and a magnetic moment of the bottom electrode in a second direction antiparallel to the first direction.

BRIEF DESCRIPTION OF THE DRAWINGS

For a more complete understanding of the principles disclosure herein, and the advantages thereof, reference is now made to the following descriptions taken in conjunction with the accompanying drawings, in which.

DETAILED DESCRIPTION

Figure 1:
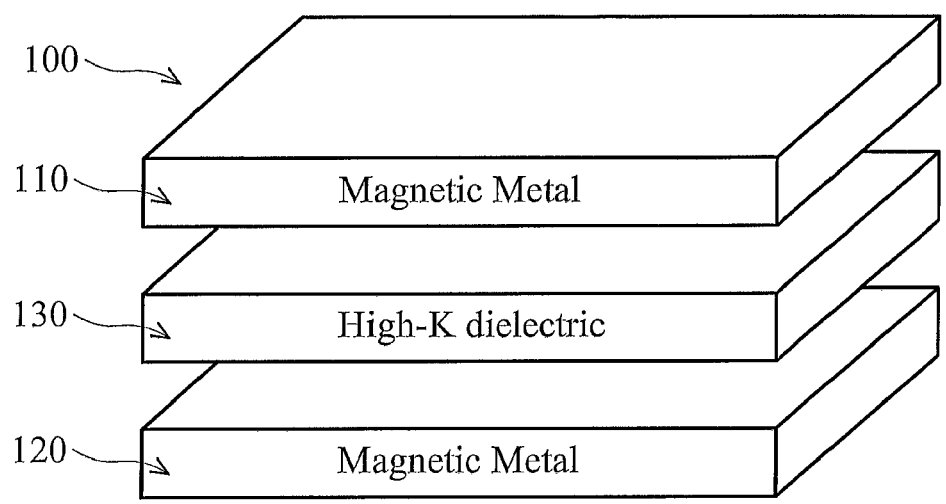
FIG. 1 illustrates one embodiment of a metal-insulator-metal (MIM) structure constructed according to the principles disclosed herein.

Referring initially to FIG. 1, illustrated is one embodiment of a metal-insulator-metal (MIM) structure 100 constructed according to the principles disclosed herein. Specifically, the disclosed MIM structure 100 includes a top electrode 110 and a bottom electrode 120, with a high-k dielectric layer 130 interposed between the top and bottom electrodes 110, 120. As used herein, the term "high-k dielectric" means a dielectric material having a dielectric constant of at least 9. Examples of high-k dielectric materials suitable for use with the disclosed principles are $Al_2O_3$, $SiO_2$, $Ta_2O_5$, MgO and HfO, but no limitation to any particular material is intended.

While the MIM structure 100 in FIG. 1 may appear to be similar to a conventional MIM structure because of the two electrodes surrounding a dielectric layer, this MIM structure 100 is distinct from known structures because of the antiparallel alignment provided between the top and bottom electrodes 110, 120. Specifically, the magnetic moments of the top and bottom electrodes 110, 120 are aligned antiparallel to each other when the MIM stack 100 is constructed. As discussed above, one of the primary concerns with the use of thin high-k dielectric layers in MIM structures is the tunneling current that usually occurs across that dielectric layer. Moreover, when ferromagnetic electrodes are employed, the tunneling current is typically spin-dependent tunneling in such conventional MIM structures.

Figure 1A:
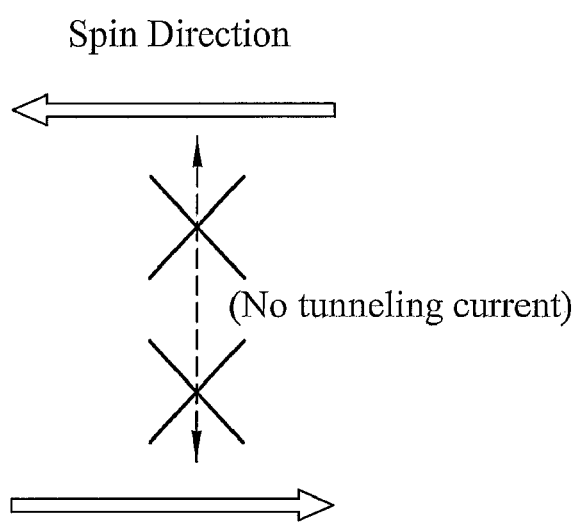
FIG. 1A illustrates the spin directions of the electrodes shown in the MIM structure of FIG. 1.

However, the disclosed principles provide for an MIM structure 100 where the spin directions of the electrodes 110, 120 are antiparallel to each other, as shown in FIG. 1A. When the spin directions of the electrodes 110, 120 are antiparallel (i.e., alignment of magnetic moments is antiparallel), no tunneling (or leakage) current passes across the high-k dielectric layer 130. This principles is set forth below in equation (2).

$$TMR = \frac{I_{\uparrow\uparrow} - I_{\uparrow\downarrow}}{I_{\uparrow\downarrow}} = \frac{2P_L P_R}{1 - P_L P_R} \quad (2)$$

In equation (2), parallel magnetizations are defined in equation (3), while antiparallel magnetizations are defined in equation (4).

$$I_{\uparrow\uparrow} \propto n_L^\uparrow n_R^\uparrow + n_L^\downarrow n_R^\downarrow \quad (3)$$

$$I_{\uparrow\downarrow} \propto n_L^\uparrow n_R^\downarrow + n_L^\downarrow n_R^\uparrow \quad (4)$$

Also in equation (2), $P_L$ and $P_R$ are the spin polarizations of left and right ferromagnets (e.g., ferromagnetic metals), and are defined respectively in equations (5) and (6) below.

$$P_L = \frac{n_L^\uparrow - n_L^\downarrow}{n_L^\uparrow + n_L^\downarrow} \quad (5)$$

$$P_R = \frac{n_R^\uparrow - n_R^\downarrow}{n_R^\uparrow + n_R^\downarrow} \quad (6)$$

Figure 2:
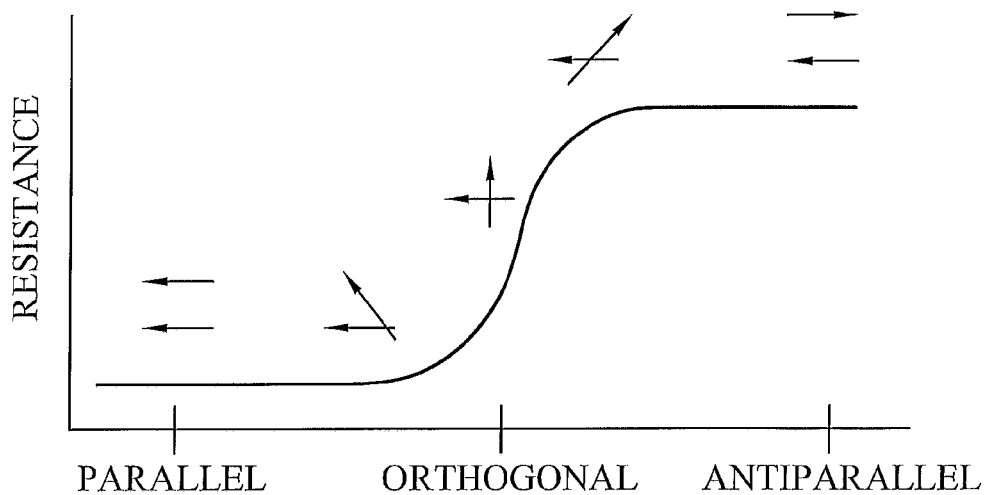
FIG. 2 illustrates a graph that shows the relationship between magnetic alignment and resistance.

Turning briefly to FIG. 2, a graph is shown that illustrates the relationship between magnetic alignment and resistance. Specifically, the electrical resistance through a dielectric layer surrounded by magnetic electrodes as the magnetic moments of the surrounding electrodes become larger. Conversely, the resistance decreases as they become more parallel. Referring back to FIG. 1, in an MIM stack, the electrical resistance of the dielectric layer 130 can therefore be controlled by aligning the magnetic moments of the surrounding electrodes 110, 120. As discussed in further detail below, the composition of electrodes 110, 120 can determine the technique used to provide the desired antiparallel alignment.

By preventing or drastically reducing leakage current across the dielectric layer 130, an MIM structure according to the disclosed principles allows the thickness of that dielectric layer to be extremely thin without the high risk of tunneling that is typically present with such thin dielectrics. In many embodiments, the thickness of the dielectric layer 130 may be reduced to only a few Angstroms. For example, if $Al_2O_3$ is employed as the dielectric layer 130, a structure 100 according to the disclosed principles may allow the dielectric layer 130 to be formed with an equivalent of oxide thickness (EOT) of only about 3 Angstroms. Of course, as discussed above, such a thin dielectric layer in an MIM stack constructed in accordance with the disclosed principles will provide a high capacitance, despite its extremely thin size.

Figure 3:
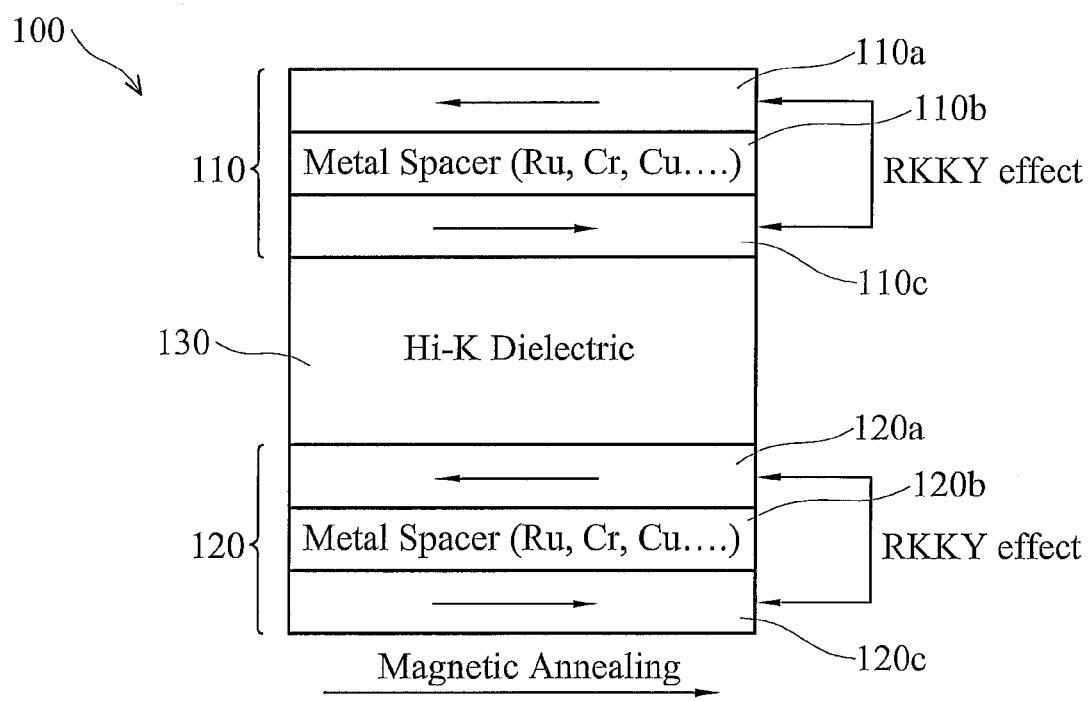
FIG. 3 illustrates a more detailed view of one embodiment of the MIM structure illustrated in FIG. 1.

FIG. 3 illustrates a more detailed view of one embodiment of the MIM structure 100 illustrated in FIG. 1. Specifically, FIG. 3 provides more detail on the construction of the top and bottom electrodes 110, 120 of the structure 100, in order to illustrate how the magnetic moments of these electrodes 110, 120 can be aligned antiparallel to each other, in accordance with the disclosed principles. Specifically, a key principle of the disclosed structure is the antiparallel alignment of the magnetic moments of the portions of the top and bottom electrodes 110c and 120a that are adjacent to the dielectric material. In exemplary embodiments of the disclosed structure 100, the first electrode 110 may be comprised of two magnetic metals 110a, 110c surrounding a non-magnetic metal spacer 110b. Likewise, the second electrode 120 may also be comprised of two magnetic metals 120a, 120c surrounding a non-magnetic metal spacer 120b. For either electrode 110, 120, the metal spacers 110b, 120b may comprise copper, chromium, ruthenium, or other beneficial metal. The upper and lower magnetic metals 110a, 110c, 120a, 120c for each electrode 110, 120 may comprise Fe, Co, Ni, B and alloys thereof.

In this embodiment of the MIM structure 100, the magnetic moments of the layers comprising the electrodes 110, 120 are aligned antiparallel to each other using a single annealing process. In addition, this embodiment provides the beneficial dielectric properties discussed above without the use of antiferromagnetic materials in the structure. More specifically, the upper and lower magnetic metals 110a, 110c, 120a, 120c for each electrode 110, 120 (respectively) are separated by the illustrated spacers 110b, 120b, which introduces the Ruderman-Kittel-Kasuya-Yosida ("RKKY") effect into the electrodes 110, 120. A single annealing process may then be performed during manufacture of the stack 100 to set the antiparallel configuration of magnetization between the top and bottom electrodes 110, 120. Although layered ferromagnetic structures such as the illustrated electrodes 110, 120 utilize the RKKY effect, and thus are very sensitive to the thickness of the non-magnetic film, this is not a disadvantage in the disclosed structure since a primary purpose of the disclosed principles is decreasing layer thickness within the stack 100. Thus, sensitivity to layer thickness due to the RKKY effect is actually used as an advantage by the disclosed technique.

Figure 4:
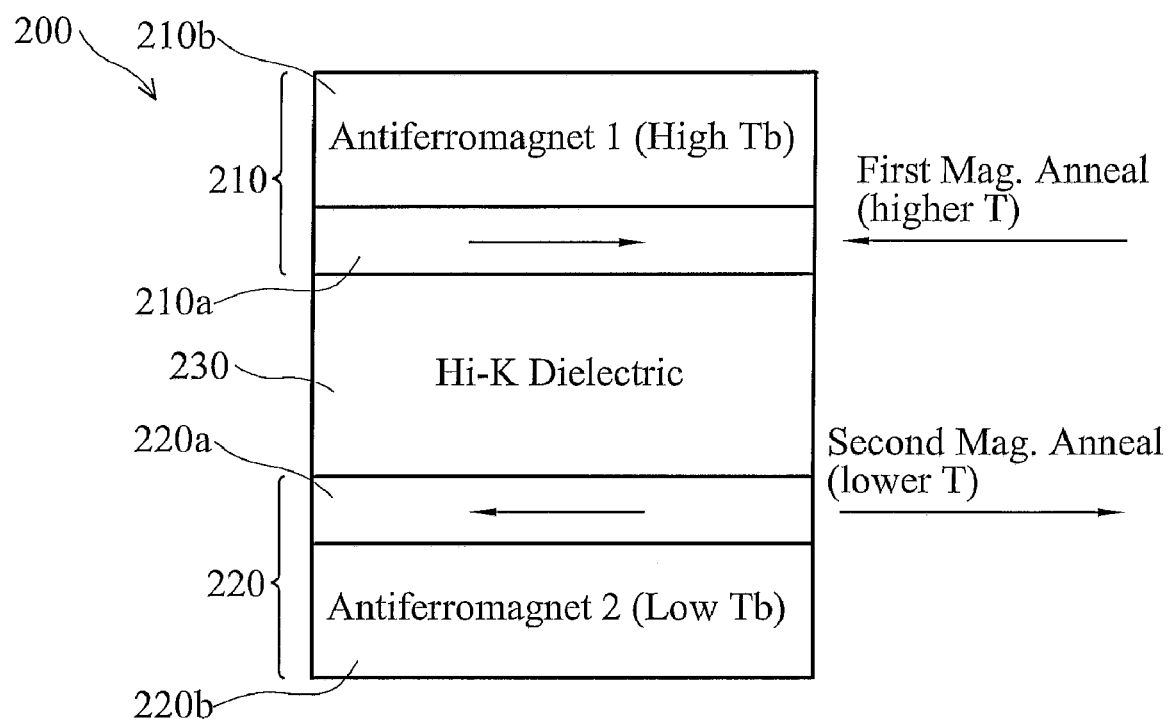
FIG. 4 illustrates another embodiment of an MIM structure constructed according to the disclosed principles, but employing two annealing steps during the manufacturing process.

FIG. 4 illustrates another embodiment of an MIM structure 200 constructed according to the disclosed principles. This structure 200 still includes top and bottom electrodes 210, 220, surrounding a high-k dielectric layer 230. However, instead of the electrodes 210, 220 being constructed of two magnetic metals surrounding a metal spacer (as in the embodiment of FIG. 3), each of the electrodes 210, 220 are comprised of a magnetic metal 210a, 220a adjacent to the high-k dielectric layer 230. On the other sides of the magnetic metals 210a, 220a are antiferromagnetic materials 210b, 220b. These antiferromagnetic materials 210b, 220b may be comprised of FeMn, PtMn, NiMn, and alloys thereof, or any other similar material.

During the manufacturing process for the MIM structure 200 of FIG. 4, a first annealing process is performed at a relatively high temperature (T). For example, in exemplary embodiments, the first anneal is performed at about the high Tb ("blocking temperature"). As shown, the first magnetic metal 210a has its magnetic moment polarized in a specific direction. Then, later in the manufacturing process, a second annealing process is performed at a relatively lower temperature (T). In exemplary embodiments, the second anneal may be performed at about the low Tb. In accordance with the disclosed principles, the blocking temperature is used to set the exchange biasing direction above a specific temperature. By applying two kinds of antiferromagents in the disclosed structure, when the second annealing process is performed, the exchange biasing direction of the high Tb antiferromagnet will not be affected since the annealing temperature of second annealing process would be lower. The second magnetic metal 220a has its magnetic moment polarized in a specific direction that is substantially antiparallel to the polarization of the magnetic metal 210a in the top electrode 210. Of course, the manufacturing process may include greater or fewer steps than these two annealing processes, without departing from the broad scope of the disclosed principles.

As disclosed above, the MIM film structure, and methods for producing the same, may be employed to decrease the leakage current of a dielectric layer having an ultra-thin thickness for increasing the capacitance of the MIM structure (per its size and thickness). In most cases, the thickness of the dielectric layer may be reduced to only a few Angstroms. The disclosed technique involves an antiparallel aligning of the direction of magnetization of the ferromagnetic materials formed adjacent to the dielectric layer. Also, the tunneling current could be fully suppressed by using half metal. (100% polarization). To accomplish such antiparallel alignment on opposing sides of the dielectric layer, only one extra processing step, an annealing process, is provided to a conventional MIM structure manufacturing process. In other embodiments, depending on the desired structure of the new MIM stack, two annealing processes may also be employed to accomplish the antiparallel alignment. Moreover, the disclosed principles may be employed to arrive at an MIM structure that may be used in almost any application, including RF, mixed-mode, or DRAM applications.

While various embodiments of the disclosed principles have been described above, it should be understood that they have been presented by way of example only, and not limitation. Thus, the breadth and scope of the invention(s) should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Brief Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A metal-insulator-metal (MIM) structure, comprising:
    a first electrode comprising a magnetized metal and having a permanent magnetic moment aligned in a first direction;
    a second electrode comprising a magnetized metal and having a permanent magnetic moment aligned in a second direction antiparallel to the first direction; and
    a dielectric layer formed between the first and second electrodes and contacting the first and second magnetized metals.

2. An MIM structure according to claim 1, wherein the magnetized metal is selected from the consisting of at least one of Ni, Fe, Co, B and alloys thereof.

3. An MIM structure according to claim 1, wherein the magnetized metal of the first and second electrodes comprises a first magnetized metal and a second magnetized metal separated by a magnetized metal spacer, the first magnetized metal contacting the dielectric layer and having a permanent magnetic moment aligned in one of the first or second directions, and the second magnetized metal having a permanent magnetic moment aligned in the other of the first or second directions.

4. An MIM structure according to claim 3, wherein the metal spacer comprises at least one selected from the group consisting of ruthenium, chromium, and copper.

5. An MIM structure according to claim 1, wherein the first and second electrodes each further comprise an antiferromagnetic material formed on the magnetized metal.

6. An MIM structure according to claim 5, wherein the antiferromagnetic material comprises at least one selected from the group consisting of PtMn, NiMn and IrMn.

7. An MIM structure according to claim 5, wherein the antiferromagnetic material of the first electrode comprises a high Tb and the antiferromagnetic material of the second electrode comprises a low Tb.

8. An MIM structure according to claim 1, wherein the dielectric layer comprises a high-k dielectric material having a dielectric constant of at least 9.

9. An MIM structure according to claim 8, wherein the high-k dielectric material is selected from the consisting of $Al_2O_3$, $SiO_2$, $Ta_2O_5$, MgO, ZrO and HfO.

10. An MIM structure according to claim 8, wherein the dielectric layer comprises a thickness of about 3 Angstroms.

11. A method of manufacturing a metal-insulator-metal (MIM) structure, the method comprising:
    forming a bottom electrode from a magnetized metal;
    growing a dielectric layer on the bottom electrode;
    forming a second electrode from a magnetized metal on the dielectric layer;
    annealing the top and bottom electrodes to align a permanent magnetic moment of the top electrode in a first direction and a permanent magnetic moment of the bottom electrode in a second direction antiparallel to the first direction.

12. A method according to claim 11, wherein forming the top and bottom electrodes comprises forming the top and bottom electrodes from a magnetized metal selected from the consisting of at least one of Ni, Fe, Co, B and alloys thereof.

13. A method according to claim 11, wherein forming the top and bottom electrodes comprises forming the top and bottom electrodes by:
    forming a first magnetized metal,
    forming a metal spacer on the first magnetized metal, and forming a second magnetized metal on the metal spacer, wherein the first magnetized metal contacts the dielectric layer, wherein the annealing further comprises annealing the top and bottom electrodes to align a permanent magnetic moment of the first magnetized metal of the top electrode in the first direction, to align a permanent magnetic moment of the first magnetized metal of the bottom electrode in the second direction, and to align a permanent magnetic moment of the second magnetized metal of the top electrode in the second direction, and to align a permanent magnetic moment of the first magnetized metal of the bottom electrode in the first direction.

14. A method according to claim 13, wherein forming a metal spacer comprises forming metal spacer comprising at least one selected from the group consisting of ruthenium, chromium, and copper.

15. A method according to claim 11, wherein forming the top and bottom electrodes further comprises forming an antiferromagnetic over the magnetized metal of top and bottom electrodes, and wherein the annealing further comprises performing a high temperature anneal to permanently align the magnetic moment of the top electrode in the first direction, and performing a low temperature anneal to permanently align the magnetic moment of the bottom electrode in the second direction.

16. A method according to claim 15, wherein performing a high temperature anneal to permanently align the magnetic moment of the top electrode in the first direction comprises performing an anneal at high Tb, and performing a low temperature anneal to permanently align the magnetic moment of the bottom electrode in the second direction comprises performing an anneal at low Tb.

17. A method according to claim 15, wherein forming an antiferromagnetic comprises forming an antiferromagnetic comprising at least one selected from the group consisting of PtMn, NiMn and IrMn.

18. A method according to claim 11, wherein growing a dielectric layer comprises growing a high-k dielectric layer having a dielectric constant of at least 9.

19. A method according to claim 18, wherein growing a dielectric layer comprises growing a high-k dielectric layer comprising a high-k dielectric material selected from the consisting of $Al_2O_3$, $SiO_2$, $Ta_2O_5$, MgO, ZrO and HfO.

20. A method according to claim 18, wherein growing a dielectric layer comprises growing a high-k dielectric layer to a thickness of about 3 Angstroms.

\* \* \* \* \*

UNITED STATES PATENT AND TRADEMARK OFFICE
CERTIFICATE OF CORRECTION

PATENT NO. : 7,529,078 B2 Page 1 of 1
APPLICATION NO. : 11/379478
DATED : May 5, 2009
INVENTOR(S) : Wang et al.

It is certified that error appears in the above-identified patent and that said Letters Patent is hereby corrected as shown below:

Column 6, Line 20, Claim 3, delete "magnetized metal spacer" and insert in lieu thereof -- nonmagnetized metal spacer --

Signed and Sealed this

Seventh Day of July, 2009

JOHN DOLL
*Acting Director of the United States Patent and Trademark Office*